United States Patent [19]

Suzuki et al.

[11] 3,891,933

[45] June 24, 1975

[54] AMPLIFIER WITH SIGNAL CLIPPING INDICATOR AND/OR PROTECTIVE CIRCUIT

[75] Inventors: Tadao Suzuki; Hirohito Kawada, both of Tokyo, Japan

[73] Assignee: Sony Corporation, Tokyo, Japan

[22] Filed: Feb. 4, 1974

[21] Appl. No.: 439,008

[30] Foreign Application Priority Data

Feb. 9, 1973 Japan ................................ 48-17436

[52] U.S. Cl. ..................... 330/2; 330/30 D; 330/51; 330/207 P

[51] Int. Cl. ........................ G01r 21/00; H01f 21/00

[58] Field of Search ............ 330/2, 51, 207 P, 30 D; 317/33 R; 307/202 R; 360/31

[56] References Cited

UNITED STATES PATENTS

| | | | |
|---|---|---|---|
| 3,286,248 | 11/1966 | Koss | 330/2 X |
| 3,434,065 | 3/1969 | Chu et al. | 330/2 |
| 3,691,427 | 9/1972 | Honda et al. | 317/33 R X |
| 3,761,775 | 9/1973 | Ozawa et al. | 330/207 P |

*Primary Examiner*—James B. Mullins
*Attorney, Agent, or Firm*—Hill, Gross, Simpson, Van Santen, Steadman, Chiara & Simpson

[57] ABSTRACT

An amplifier with a signal clipping indicator and/or a protective circuit having an amplifying stage with a negative feedback loop which amplifies an input signal applied to the input terminal thereof and compares the input signal with a negative feedback signal for producing a control signal when the waveforms of the two signals are different, a signal clipping indicator controlled by the control signal for indicating the clipping state of the amplifier, and a protective circuit controlled by the control signal for protecting the amplifier from injury. By way of example, an indicating circuit using a monostable multivibrator and a photodiode or luminous diode may be employed as the indicator.

9 Claims, 2 Drawing Figures

AMPLIFIER WITH SIGNAL CLIPPING INDICATOR AND/OR PROTECTIVE CIRCUIT

BACKGROUND OF THE INVENTION

1. Field of the Invention

This invention relates generally to an amplifier with a signal clipping indicator and/or protective circuit, and more particularly to an amplifier with a signal clipping indicator and/or a protective circuit suitable for producing a signal without clipping and having a fast response characteristic for detecting a signal clipping condition.

2. Description of the Prior Art

There have been previously proposed various excess load protective circuits for a stereo power amplifier which detect when an excess input is applied to the stereo power amplifier or detects when an excess load is applied to the stereo power amplifier caused by the short-circuiting of loads and these circuits protect an output transistor or the load.

With such prior art protective circuits, the operation of the stereo power amplifier is stopped when the collector loss $P_c$ of the output transistor exceeds a predetermined value.

One of the inventors of the present invention has invented an excess load protective circuit identified as application, Ser. No. 382,139, filed July 24, 1974. With this protective circuit, there is provided a detecting circuit for detecting the impedance of a load such as a speaker or the like and the operation of the amplifier is stopped when the impedance value is lowered beyond a predetermined value and when a current exceeding a predetermined value flows through its output transistor.

With the prior art protective circuits, since they are all of the collector loss of the output transistor or of the load impedance detecting type, the output signal from the amplifier or that applied to the speaker is clipped in waveform and hence the audio reproduction quality is deteriorated, and such clipping state can not be detected by the prior art circuits.

SUMMARY OF THE INVENTION L

Accordingly, it is an object of the present invention to provide an amplifier with a signal clipping indicator and/or a protective circuit which is free from the drawbacks encountered in the prior art.

It is another object of the invention to provide an amplifier with a signal clipping indicator and/or a protective circuit in which an output signal obtained at the output terminal of the amplifier is compared with an input signal applied to the input terminal of the amplifier. A detecting circuit is provided for detecting when these signals are different in waveform due to the waveform of the output signal being clipped and the clipping state of the output signal is indicated by the output signal from the detecting circuit.

It is further object of the invention to provide an amplifier with a signal clipping indicator and/or a protective circuit in which the output signal obtained at the output terminal of the amplifier is compared with an input signal applied to its input terminal. A detecting circuit is provided for detecting when these signals are different in waveform because a load connected to the output terminal of the amplifier is short-circuited. The operation of the amplifier is stopped or the signal applied to the load is cut off by the detected output signal.

It is a still further object of the invention to provide an amplifier with a signal clipping and/or a protective circuit which has at least one differential amplifier, one input terminal of the differential amplifier being supplied with an input signal to be amplified while its other input terminal is supplied with a signal such that it is in phase opposition to the input signal and hence a negative feedback is applied to the amplifier. A detecting circuit is provided at the collector side of the differential amplifier for detecting the clipping state of the signal waveform.

The other objects, features and advantages of the invention will become apparent from the following description taken in conjunction with the accompanying drawings.

DESCRIPTION OF THE PREFERRED EMBODIMENTS

An example of the present invention is described with reference to FIG. 1.

Figure 1:
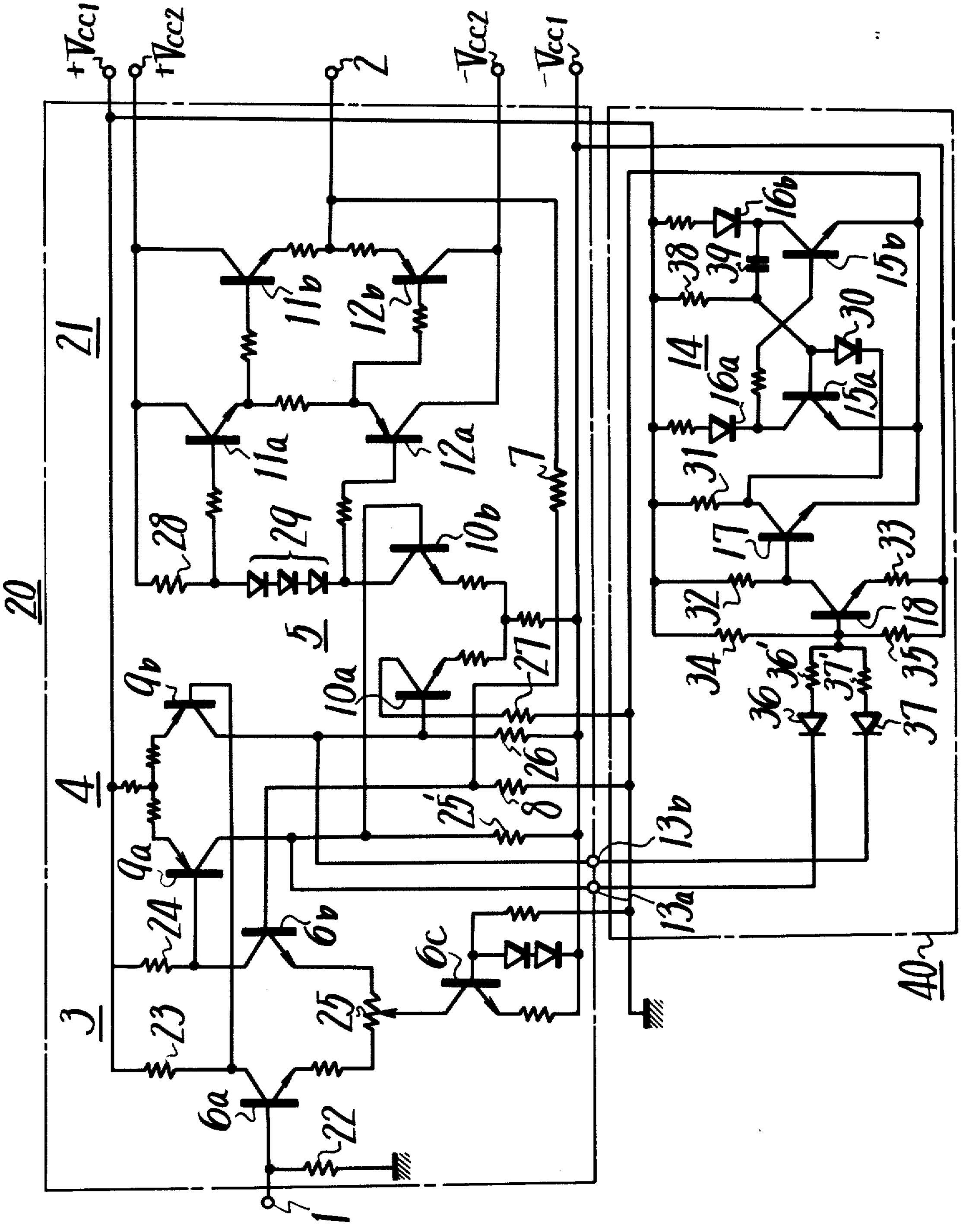
FIG. 1 is a circuit diagram for showing an example of the amplifier according to the present invention.

In FIG. 1, reference numeral 20 indicates generally a power amplifier, and 40 indicates generally a detecting circuit which detects the clipping state of the output signal of the power amplifier 20 or the existence of a short-circuit of a load of the power amplifier 20.

The power amplifier 20 consists of differential amplifiers 3, 4 and 5 and a push-pull output stage 21. An input terminal 1 of the power amplifier 20 is supplied with the output signal from a preamplifier (not shown) and an output terminal 2 of the power amplifier 20 is connected to a load such as a speaker (not shown). The differential amplifiers 3, 4 and 5 are connected between positive and negative voltage sources $+V_{cc1}$ and $-V_{cc1}$, respectively. The differential amplifier 3 consists of a pair of NPN-type transistors **6*a* and 6*b* and an NPN-type transistor 6*c*. The base of transistor 6*a* is supplied with the input signal from the input terminal 1. The base of the other transistor 6b is supplied with the output signal of the power amplifier 20 through resistor 7. Resistor 8 is connected between ground and the base of transistor 6*b*. The emitters of transistors 6a and 6b are connected together and connected to a constant current circuit which includes the transistor 6c. The signal path from the output terminal 2 to the base of transistor 6*b***forms a negative feedback loop and in the illustrated circuit, a negative feedback signal in phase with the input signal is applied thereto.

A resistor 22 is connected between the base of transistor 6a and ground and provides for setting the input impedance of the differential amplifier 3. Resistors 23 and 24 are connected to the collectors of transistors **6*a* and 6*b* as load resistors, and a resistor 25 is connected between the emitters of transistors 6*a* and 6*b* and is used for adjusting the DC voltage at the output terminal 2**.

The second differential amplifier 4, is connected to the output terminal of differential amplifier 3, and consists of a pair of PNP-type transistors **9*a* and 9*b*. The third differential amplifier 5, which is connected in cascade to the differential amplifier 4, consists of a pair of NPN-type transistors 10*a* and 10*b***.

Resistors 25 and 26 are connected to the collectors of transistors 9*a* and 9*b*, respectively, and serve as loads for the differential amplifier 4. Resistors 27 and 28 are connected to the collectors of transistors 10a and 10b and serve as loads for the differential amplifier 5. NPN-type transistors 11*a* and 11*b* are connected in Darlington connection. PNP-type transistors 12*a* and 12*b* are also connected in Darlington connection. The bases of transistors 11*a* and 12 are connected to the collector of transistor 10*b* through resistors and diodes 29 and between voltage sources $+V_{cc2}$ and $-V_{cc2}$ in complementary fashion to form the push-pull output stage 21. Diodes 29 are connected to the collector of transistor 10*b* and serve for setting the no load current for the respective transistors.

One of the differential amplifiers 3, 4 or 5, as for example, differential amplifier 4, is connected so that detecting terminals 13*a* and 13*b* are connected to the collectors of transistors 9*a* and 9*b*, respectively.

In normal operation, the amplifier 20 produces an output signal delivered to the output terminal 2 which has been divided by the resistors 7 and 8 so as to have a phase so as to be a negative feedback signal with respect to the input signal. The signal at terminal 2 is applied to the base of transistor 6*b* of differential amplifier 3 to apply negative feedback, so that the normal level of signals, for example, positive and negative signals of about several volts appear at the detecting terminals 13*a* and 13*b*, respectively.

However, when an excessive load is applied to the amplifier 20, for example, the output terminal 2 is short-circuited, and the negative feedback signal applied to the base of transistor 6*b* becomes substantially zero, so that the differential amplifier 3 operates as open gain loop. As a result, when the input signal applied to the input terminal 1 is a positive half cycle, the transistor 6*a* of the first stage differential amplifier 3 will be made conductive and the transistor 6*b* will be made nonconductive. Consequently, the transistor 9*a* of the next stage differential amplifier 4 is made nonconductive and transistor 9*b* is made conductive. As a result, the voltage at the detecting terminal 13*a* connected to the collector of transistor 9*a* closely approaches the voltage of voltage source $-V_{cc1}$. At this time, the voltage of the other detecting terminal 13*b*approaches the emitter voltage of transistor 9*b*.

When an excess input signal is applied to the input terminal 1 and a part of the positive half cycle of the output signal is clipped, the voltage of the detecting terminal 13*a* approaches the voltage of the voltage source $-V_{cc1}$. When the voltage at detecting terminal 13*b* approaches the voltage of voltage source $-V_{cc1}$ when a negative half cycle of the output signal is partially clipped.

As described above, when the output terminal 2 of the amplifier 20 is short-circuited or an excess input signal is applied to the amplifier 20, the voltage at detecting terminal 13*a* or 13*b* approaches the voltage of voltage source $-V_{cc1}$. For this reason, the detecting circuit 40 is connected to the detecting terminals 13*a* and 13*b* so as to detect the clipping state of the output signal at the output terminal 2 or the excess load and then indicates the same.

The detecting circuit 40 includes a monostable multivibrator 14 which is formed of transistors 15*a* and 15*b*, connected between the voltage source $+V_{cc1}$ and ground. An indicator element, such as a luminous diode or photodiode 16*a*, which may emit a green light, is inserted into the collector current path of transistor 15*a* and another indicator element such as a luminous diode or photodiode 16*b* which may emit a red light, is inserted into the collector current path of transistor 15*b*. The base of transistor 15*a* is connected to the collector of an NPN-type transistor 17 through a diode 30. The emitter of transistor 17 is grounded, and its collector is connected through a resistor 31 to the voltage source $+V_{cc1}$. The base of transistor 17 is connected to the collector of an NPN-type transistor 18. The collector of transistor 18 is connected through a resistor 32 to the voltage source $+V_{cc1}$, and its emitter is connected through a resistor 33 to the voltage source $-V_{cc1}$ and its base is connected to the voltage source $+V_{cc1}$ through a resistor 34 and also to the voltage source $-V_{cc1}$ through a resistor 35. The base of transistor 18 is also connected to the detecting terminals 13*a* and 13*b* through resistors 36' and 37' and diodes 36 and 37 with illustrated polarity, respectively.

With the above described circuit, when the amplifier 20 operates normally, only a few volts of output signals are delivered to the detecting terminals 13*a* and 13*b*. The transistor 18 in the detecting circuit 40 will be conductive and hence the transistor 17 will be made nonconductive. This causes transistor 15*a* of monostable multivibrator 14 to be made conductive but transistor 15*b* will be nonconductive. Thus, the luminous diode 16*a* will be energized and will emit green light which indicates that the amplifier 20 is is operating normally. On the other hand, when the amplifier 20 is subjected to an excess load or the load is short-circuited or the output signal is clipped, the voltages at the detecting terminals 13*a* and 13*b* approach that of the voltage source $-V_{cc1}$. This causes the diode 36 or 37 to be biased to the voltage of voltage source $-V_{cc1}$, and the transistor 18 is made nonconductive and transistor 17 is made conductive. This causes transistor 15*a* to be nonconductive and transistor 15*b* becomes conductive. Thus, the green luminous diode 16*a* is extinguished, and the red luminous diode 16*b* is lighted to indicate that the amplifier 20 is subjected to over load or that the output signal is clipped. The transistor 15*a* remains in the nonconductive state and transistor 15*b* in the conductive state for a predetermined time period which is determined by the time constant of a resistor 38 and a capacitor 39 provided in the monostable multivibrator 14.

Figure 2:
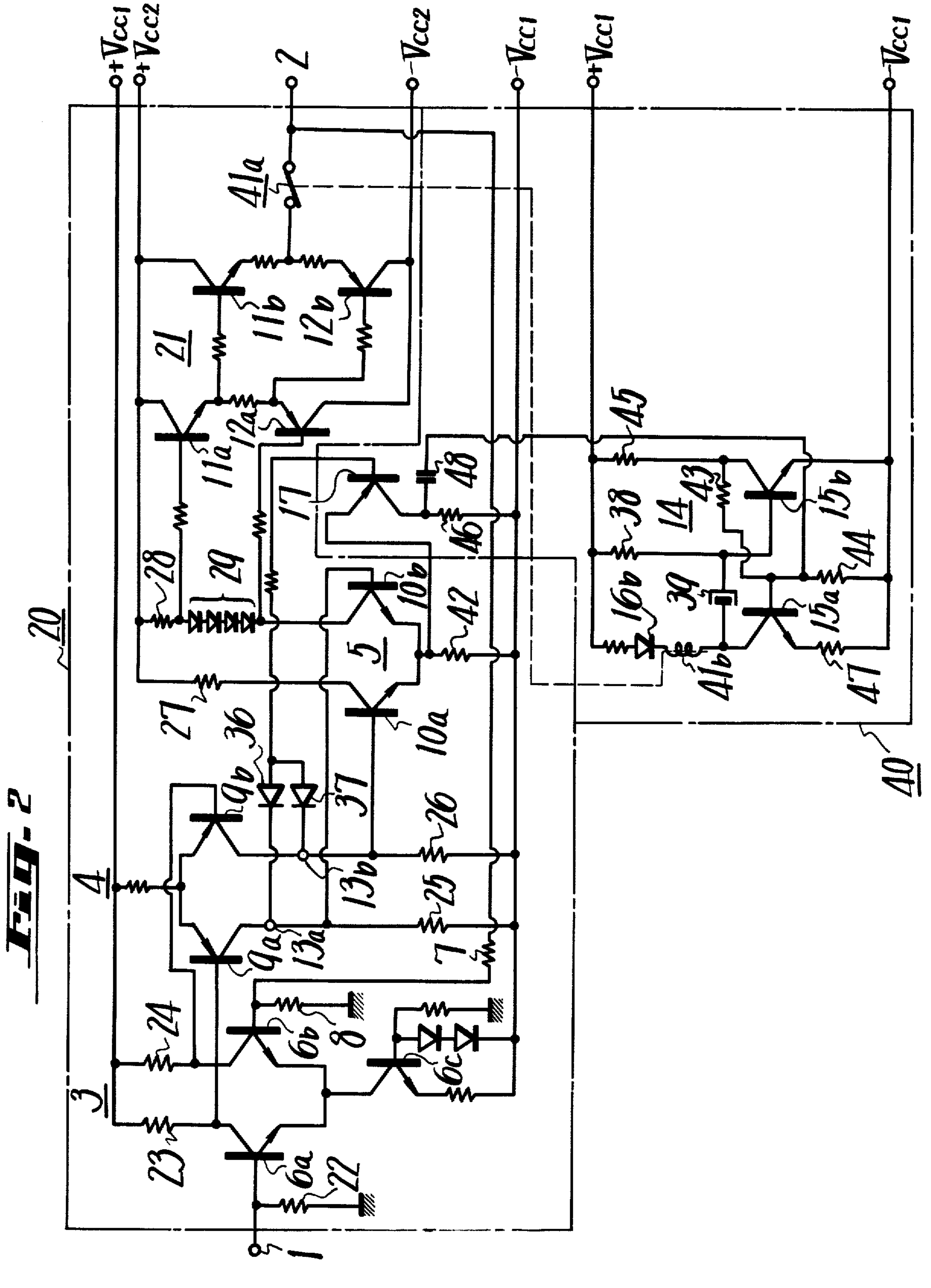
FIG. 2 is a circuit diagram for showing another example of the amplifier of the present invention.

Another example of the present invention is shown in FIG. 2. The example of FIG. 2 is substantially the same as that of FIG. 1 except that a protective circuit, which mutes the output signal of the amplifier 20 when the load is short-circuited or the output signal at the output terminal 2 is clipped, is additionally, provided. The same reference numerals used in FIG. 2 designate the same elements as those illustrated in FIG. 1.

In FIG. 2, a normally closed relay contact 41*a* is inserted between the connection point of transistors 11*b* and 12*b* and the output terminal 2. The connection point between the commonly connected emitters of transistors 10*a* and 10*b* of the third stage differential amplifier 5 and a resistor 42, which has its other end connected to the voltage source $-V_{cc1}$, is connected to the emitter of transistor 17. The collector of transistor 17 is connected through a resistor 46 to the voltage source $-V_{cc1}$ and its base is connected to the detecting terminals 13*a* and 13*b* through the diodes 36 and 37 which the polarity shown in FIG. 2.

The detecting circuit 40 includes the monostable multivibrator 14 comprising the transistors 15*a* and 15*b* as in the structure of FIG. 1. The collector of transistor 15*a* is connected to the voltage source $+V_{cc1}$ through a relay coil 41*b*, which actuates the relay contact 41a. The indicator element such as the red luminous diode 16*b* is connected to relay coil 41*b*. The emitter of transistor 15*a* is connected through a resistor 47 to the voltage source $-V_{cc1}$ and its base is connected through a resistor 43 to the collector of transistor 15*b* and the base is also connected through a resistor 44 to the voltage source $-V_{cc1}$. The collector of transistor 15*b* is connected through a resistor 45 to the voltage source $+V_{cc1}$ and its emitter is connedted to the voltage source $-V_{cc1}$. The connection point between the collector of transistor 17 and the resistor 46 is connected through a capacitor 48 to the base of transistor 15*a*.

The example shown in FIG. 2 operates as follows. When the input signal applied to the input terminal 1 of power amplifier 20 has an adequate level and when the load is not short-circuited and when the power amplifier 20 operates normally, voltage of ± a few volts exists at the detecting terminal 13*a* or 13*b* for the same reasons described in connection with the example of FIG. 1. The diodes 36 and 37 are reverse biased by the detected voltage at the terminals 13*a* and 13*b*, respectively, and the transistor 17 is made nonconductive. As a result, no control voltage is obtained at the base of transistor 15*a* of monostable multivibrator 14 through the capacitor 48 and hence the transistor 15*a* will be in the nonconductive state. Accordingly, the red luminous diode 16*b* is not lighted, which indicates that the power amplifier 20 is operating normally. In this state, the relay coil 41*b* will not be energized by the control signal, and the relay contact 41*a* is held in the closed state to deliver the normal output signal to the output terminal 2 of the amplifier 20.

When the load is short-circuited or the excess input signal is supplied to the input terminal 1 and the output signal appeared at the output terminal 2 is clipped, the voltage of the voltage source $-V_{ccl}$ is supplied to the detecting terminal 13*a* or 13*b*. Thus, the diode 36 or 37 is biased forwardly by the voltage at the terminal 13*a* or 13*b* which makes the transistor 17 conductive. As a result, a control voltage is produced across the resistor 46 which control voltage is supplied through the capacitor 48 to the base of transistor 15*a* to make it conductive. Thus, the luminous diode 16*b* connected to the collector of transistor is lighted to indicate that the power amplifier 20 is in an abnormal state. At this time, the relay coil 41*b* will be energized which opens normally closed relay contact 41*a* so as to interrupt the delivery of the signal from the amplifier 20 to output terminal 2. That is, when the load is short-circuited or the output signal is clipped, no signal will be fed to the load which protects the power amplifier or load from destruction during such abnormal state.

With the embodiment shown in FIG. 2, when the abnormal state occurs, the path between the connection point of transistors 11*b* and 12*b* and the output terminal 2 will be opened, but it is also possible, for example, to stop operation of transistors 11*b* and 12*b* or to mute the signal applied to the input terminal 1 by placing the switch 41*a* in a position to accomplish such results.

Further, when the abnorml state is detected, the transistors 15*a* and 15*b* of monostable multivibrator 14 are held in that condition for a time interval determined by the time constant circuit consisting of the capacitor 39 and resistor 38, and the protective operation will be positively performed.

As may be apparent from the above description, with the present invention the conditions when an excess signal is applied to the amplifier or the load is short-circuited are positively detected and indicated so the operator knows that the amplifier is in an abnormal state. The protective circuit for the amplifier is also driven at this time. Thus, the amplifier according to the present invention provides great protection.

Further, the detecting circuit for detecting the abnormal state of the invention is formed so as to detect the signal variations in the negative feedback loop of the amplifier for amplifying the main signal, and the control voltage of a high level is obtained at the detecting terminal even when the signal at the output terminal is clipped only slightly. Thus, the present invention has superior response characteristics and is very reliable.

Further, since the control signal is obtained from the output terminal of the amplifier for the main signal, there is no need to provide a special detecting circuit in the amplifier with the result that the amplifier itself is very simple in construction and also the detecting circuit can be independently used as an adapter, which means that the present invention can be widely applied.

The above description is based on the preferred embodiments, but it is not intended that it be limited to the particular embodiments. Accordingly, it will be apparent that many modifications and variations could be effected by those skilled in the art without departing from the spirit and scope of the novel concepts of the invention.

We claim as our invention:

1. An audio amplifier with a signal clipping and/or a protective circuit comprising, a first differential amplifier comprising first and second transistors with their emitters coupled together, an input terminal connected to the base of said first transistor, positive and negative biasing terminals with said positive terminal coupled to the collectors of said first and second transistors, a third transister connected between the emitters of said first and second transistors and said negative biasing terminal, a second differential amplifier comprising fourth and fifth transistors with their emitters coupled to said positive biasing terminal and their collectors to said negative biasing terminal, the base of said fourth transistor connected to the collector of said second transistor, the base of said fifth transistor connected to the collector of said first transistor, a push pull output stage connected to said fourth and fifth transistors, an output terminal connected to said output stage and connected to the base of said second transistor and supplying a negative feedback signal thereto, a pair of detecting terminals connected, respectively, to the collectors of said fourth and fifth transistors, and protective circuit means connected to said pair of detector terminals to protect said audio amplifier when the signal at said pair of detecting terminals exceeds predtermined limits.

2. An amplifier with a signal clipping indicator and/or a protective circuit according to claim 1, further including a third differential amplifier comprising sixth and seventh transistors connected between said second differential amplifier and said push-pull amplifying stage.

3. An amplifier with a signal clipping indicator and/or a protective circuit according to claim 2, wherein said protective circuit means comprises an eighth switching transistor with base coupled to said pair of detector terminals, a monostable multivibrator and an indicator, said eighth switching transistor coupled to said monostable multivibrator to invert is ON state and said indicator connected to said monostable multivibrator to indicate when said multivibrator has its ON stage inverted.

4. An amplifier with a signal clipping indicator and/or a protective circuit according to claim 3 wherein including a pair of diodes connected between pair of detector terminals and the base of said eighth switching transistor.

5. An amplifier according to claim 4 wherein said indicator comprises a red light which is illuminated when said multivibrator has its ON stage inverted.

6. An amplifier according to claim 5 wherein said indicator includes a green light which is illuminated when said multivibrator does not have its ON stage inverted.

7. An amplifier according to claim 1 wherein said protective circuit includes a sixth transistor connected to said pair of detector terminals and under normal satisfactory operating conditions biased to the nonconducting state, a relay connected to said sixth transistor and energized when said sixth transistor conducts, and a switch connected between said output terminal and said push-pull output stage and said relay controlling said switch to open it when said sixth transistor conducts.

8. An amplifier with a signal clipping indication and/or a protective circuit comprising:

a. a voltage source;

b. a first differential amplifier having first and second transistors each having base, emitter and collector, the emitters of said first and second transistors being connected together and connected to one terminal of said voltage source through a common emitter impedance, the base of said first transistor being supplied with an input signal to be amplified;

c. first and second resistors each connected between the other terminal of said voltage source and each collector of said first and second transistors;

d. signal output means connected to at least one of said first and second resistors;

e. feedback means connected between said signal output means and the base of said second transistor so as to supply a feedback signal having the same phase and amplitude as said input signal supplied to the base of said first transistor; and f. means for detecting an abrupt voltage change at one of said collectors of said first and second transistors and for producing a control signal when an unbalance exists between said input signal and said feedback signal whereby said control signal is indicative of a clipping state produced in said signal output means.

9. An amplifier with a signal clipping indication and/or a protective circuit according to claim 8, wherein said signal output means comprises a push-pull amplifying stage having input and output terminals, said input terminal being connected to said either one of said first and second resistors and a load connected to said output terminal, said feedback means is provided between said output terminal of said push-pull amplifying stage and the base of said second transistor.

* * * * *